United States Patent
Blatz et al.

(10) Patent No.: US 10,158,336 B2
(45) Date of Patent: Dec. 18, 2018

(54) AUTOMATIC GAIN CONTROL FOR RECEIVED SIGNAL STRENGTH INDICATION

(71) Applicant: ATMEL Corporation, San Jose, CA (US)

(72) Inventors: Werner Blatz, Leingarten (DE); Michael Sagebiel, Leingarten (DE); Thomas Janz, Ulm (DE); Martin Fischer, Heilbronn (DE); Daniel Moser, Korntal-Muenchingen (DE); Jan Knopf, Heilbronn (DE)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 15/627,214

(22) Filed: Jun. 19, 2017

(65) Prior Publication Data

US 2018/0041179 A1    Feb. 8, 2018

Related U.S. Application Data

(63) Continuation of application No. 15/061,981, filed on Mar. 4, 2016, now Pat. No. 9,729,119.

(51) Int. Cl.
*H04L 27/08* (2006.01)
*H03G 3/30* (2006.01)
(Continued)

(52) U.S. Cl.
CPC ......... *H03G 3/3036* (2013.01); *H03G 3/3052* (2013.01); *H03G 3/3073* (2013.01);
(Continued)

(58) Field of Classification Search
CPC .... H03G 3/3052; H03G 3/3068; H03G 3/001; H03G 3/3078; H04L 27/3809
(Continued)

(56) References Cited

U.S. PATENT DOCUMENTS 4,891,841 A * 1/1990 Bohn ............. H03G 5/025
                                                    333/28 T
5,390,053 A * 2/1995 Averill ........... H03G 1/007
                                                    360/46
(Continued)

FOREIGN PATENT DOCUMENTS

DE    10159551       6/2003
DE    102009021153   11/2010

OTHER PUBLICATIONS

US 9,685,925, 06/2017, Blatz et al. (withdrawn)
(Continued)

*Primary Examiner* — James M Perez
(74) *Attorney, Agent, or Firm* — Fish & Richardson P.C.

(57) ABSTRACT

In some implementations, an automatic gain control (AGC) circuit comprises: a pre-divider circuit operable to pre-divide an input signal according to a pre-divider circuit setting and output a pre-divided signal; a pre-amplifier operable to pre-amplify the pre-divided signal and output a pre-amplified signal; a post-divider circuit operable to post-divide the pre-amplified signal according to a post-divider circuit setting; an analog-to-digital converter (ADC) operable to generate a digital data stream from the post-divided signal; logic operable to sample the digital data stream; determine a pre-divider circuit setting and a post-divider circuit setting based on the sampled data stream; set the pre-divider circuit and the post-divider circuit based on the determined settings; and generate a received signal strength value based on the pre-divider circuit setting and the post-divider circuit setting.

20 Claims, 16 Drawing Sheets

(51) Int. Cl.
*H04B 17/318* (2015.01)
*H04B 17/21* (2015.01)
(52) U.S. Cl.
CPC .......... *H03G 3/3084* (2013.01); *H04B 17/21* (2015.01); *H04B 17/318* (2015.01)
(58) Field of Classification Search
USPC ............................ 375/316–352, 355–376
See application file for complete search history.

(56) References Cited

U.S. PATENT DOCUMENTS

| | | | | |
|---|---|---|---|---|
| 5,431,159 A * | 7/1995 | Baker | ............... | A61B 5/14551 356/41 |
| 5,861,831 A * | 1/1999 | Murden | ............... | H03M 1/186 341/118 |
| 6,011,435 A * | 1/2000 | Takeyabu | ............ | H03F 3/45475 330/252 |
| 6,160,443 A * | 12/2000 | Maalej | ............... | H04L 1/0057 329/304 |
| 6,321,073 B1 * | 11/2001 | Luz | ..................... | H03G 3/3068 330/278 |
| 6,331,802 B1 * | 12/2001 | Kim | ....................... | H03G 7/06 330/133 |
| 6,538,343 B1 * | 3/2003 | Stewart | ..................... | H02J 3/14 307/38 |
| 6,545,532 B1 * | 4/2003 | Maalej | ............... | H04L 1/0057 329/304 |
| 6,597,395 B1 * | 7/2003 | Kim | ....................... | H04N 5/18 348/222.1 |
| 6,940,539 B1 * | 9/2005 | Tokman | ............ | H04N 5/23203 330/302 |
| 7,231,006 B2 * | 6/2007 | Yamauchi | ............ | H03G 3/3052 375/345 |
| 7,324,561 B1 * | 1/2008 | Miller | .................... | H03K 5/08 331/182 |
| 7,519,348 B2 * | 4/2009 | Shah | ....................... | H03D 7/14 455/285 |
| 7,583,946 B2 * | 9/2009 | Kerth | ..................... | H04B 1/28 331/19 |
| 7,634,244 B2 * | 12/2009 | Burns | ................. | G01R 31/2607 330/254 |
| 7,643,599 B2 * | 1/2010 | Willis | .................. | H03D 13/003 327/12 |
| 7,822,111 B2 * | 10/2010 | Sohn | ................. | H04L 25/03038 375/231 |
| 7,885,683 B2 * | 2/2011 | Rofougaran | ............ | H03F 3/211 455/141 |
| 8,044,713 B2 * | 10/2011 | Grosskinsky | ............ | H04L 27/06 329/304 |
| 8,199,864 B1 * | 6/2012 | Kim | ................... | H04L 27/0014 375/281 |
| 8,374,231 B2 * | 2/2013 | Tan | .................... | H04L 25/0216 375/231 |
| 8,396,109 B2 * | 3/2013 | Farjad-rad | ........ | H04L 25/03019 375/232 |
| 8,472,532 B2 * | 6/2013 | Schley-May | ............ | H04B 3/02 375/257 |
| 8,638,249 B2 * | 1/2014 | Kropfitsch | ............. | H03G 3/002 329/347 |
| 8,638,883 B2 * | 1/2014 | Ashkenazi | ............ | H04L 25/061 375/319 |
| 8,675,714 B2 * | 3/2014 | Cheung | ............ | H04L 25/03885 375/214 |
| 8,712,358 B2 * | 4/2014 | Martin | .................. | H03M 1/185 375/345 |
| 8,718,127 B2 * | 5/2014 | Acosta-Serafini | ......................... H04L 25/03878 | 327/559 |
| 8,798,116 B2 | 8/2014 | Pullela | | |
| 8,798,216 B2 * | 8/2014 | Pullela | ............... | H03D 7/165 375/318 |
| 8,818,311 B2 * | 8/2014 | Persico | ................ | H03G 3/3078 455/226.2 |
| 8,855,186 B2 * | 10/2014 | Tan | ................... | H04L 25/03885 375/213 |
| 8,929,494 B2 * | 1/2015 | Lee | ................ | G06K 7/10356 375/144 |
| 8,958,504 B2 * | 2/2015 | Warke | ................ | H04L 27/0014 375/235 |
| 8,971,456 B2 * | 3/2015 | Galan | ................. | H04B 1/0071 375/340 |
| 9,008,168 B2 * | 4/2015 | Miller | .................... | H04N 5/268 375/232 |
| 9,048,938 B2 * | 6/2015 | Hiscock | ................ | H04B 1/713 |
| 9,191,127 B2 * | 11/2015 | Koli | .................... | H03H 19/008 |
| 9,246,719 B2 * | 1/2016 | Pullela | .................. | H03D 7/165 |
| 9,300,461 B2 * | 3/2016 | Akita | ....................... | H03L 7/087 |
| 9,444,515 B2 * | 9/2016 | Khan | ..................... | H04W 4/80 |
| 9,729,119 B1 * | 8/2017 | Blatz | .................... | H03G 3/3036 |
| 2003/0020552 A1 * | 1/2003 | Troy | ....................... | H03L 7/183 331/34 |
| 2003/0186647 A1 * | 10/2003 | Ikeda | ..................... | H04H 40/90 455/3.02 |
| 2004/0264608 A1 * | 12/2004 | Habuka | ................ | H03G 3/3068 375/345 |
| 2005/0275473 A1 * | 12/2005 | Thies | ..................... | H03L 7/095 331/34 |
| 2006/0188043 A1 * | 8/2006 | Zerbe | ..................... | H04L 1/0026 375/346 |
| 2006/0293017 A1 * | 12/2006 | Kim | ..................... | H03D 7/1433 455/323 |
| 2007/0080835 A1 * | 4/2007 | Maeda | ................... | H03D 3/009 341/120 |
| 2007/0216482 A1 * | 9/2007 | Hollenbeck | ............. | H03F 3/191 330/254 |
| 2008/0080658 A1 * | 4/2008 | Huang | .................. | H03L 7/095 375/376 |
| 2008/0092205 A1 * | 4/2008 | Miller | .................. | H04M 11/066 725/149 |
| 2008/0132191 A1 * | 6/2008 | Quinlan | ................... | H03D 7/18 455/302 |
| 2008/0233873 A1 * | 9/2008 | Rofougaran | ............ | H03F 3/211 455/41.2 |
| 2008/0284487 A1 * | 11/2008 | Pullela | ............... | H03D 7/1441 327/355 |
| 2009/0143031 A1 * | 6/2009 | Shah | ....................... | H03D 7/14 455/114.1 |
| 2009/0168939 A1 * | 7/2009 | Constantinidis | .... | H04W 52/028 375/359 |
| 2009/0206925 A1 * | 8/2009 | Grosskinsky | ........... | H04L 27/06 329/304 |
| 2009/0261910 A1 * | 10/2009 | Locker | ..................... | H03L 7/18 331/34 |
| 2009/0286487 A1 * | 11/2009 | Rofougaran | ............ | H03B 21/01 455/73 |
| 2010/0330947 A1 * | 12/2010 | Khoury | .................... | H04B 1/28 455/302 |
| 2012/0021712 A1 * | 1/2012 | Mikhemar | ............. | H03F 1/086 455/234.1 |
| 2012/0063555 A1 * | 3/2012 | Pullela | .................. | H04B 1/1638 375/350 |
| 2012/0076246 A1 * | 3/2012 | Okada | .................. | H03G 3/3068 375/340 |
| 2012/0274398 A1 * | 11/2012 | Alavi | ..................... | H03F 3/189 330/1 R |
| 2014/0030991 A1 * | 1/2014 | Liu | ..................... | H04B 17/004 455/115.3 |
| 2014/0035650 A1 * | 2/2014 | Zerbe | ..................... | H03L 7/06 327/299 |
| 2014/0140444 A1 * | 5/2014 | Onishi | .................... | H04B 1/10 375/320 |
| 2014/0179251 A1 * | 6/2014 | Persico | ................ | H03G 3/3078 455/226.2 |

(56) References Cited

U.S. PATENT DOCUMENTS

2014/0270002 A1* 9/2014 Schubert ............... H04L 1/0045
                                                                  375/320
2015/0365118 A1* 12/2015 Khan ................... H03G 3/3052
                                                                  375/219
2016/0328936 A1* 11/2016 Fischer ................ G08B 17/107

OTHER PUBLICATIONS

International Search Report and Written Opinion of the International Searching Authority, PCT Application Serial No. PCT/US2017/020822, dated Jun. 9, 2017, 16 pp.

* cited by examiner

AUTOMATIC GAIN CONTROL FOR RECEIVED SIGNAL STRENGTH INDICATION

CROSS-REFERENCE TO RELATED APPLICATION

This application is a continuation of and claims priority to U.S. application Ser. No. 15/061,981, filed Mar. 4, 2016, the entire contents of which is incorporated herein by reference.

TECHNICAL FIELD

The subject matter of this disclosure relates generally to determining received signal strength of magnetic fields.

BACKGROUND

A received signal strength indicator (RSSI) of enforced electro-magnetic or pure magnetic fields can be used in vehicle access or passive-entry-go (PEG) systems to determine the distance between a transmitter located in the vehicle and a receiving system located in a key fob. The RSSI can be determined by measuring the voltage of a continuous waveform (CW) signal that is transformed from an electro-magnetic or pure magnetic field by an antenna or a coil. If the CW signal is corrupted by distortion the constant envelope of the CW signal starts to vary, leading to inaccurate RSSI information and an inaccurate distance measurement.

SUMMARY

In some implementations, an automatic gain control (AGC) circuit comprises: a pre-divider circuit operable to pre-divide an input signal according to a pre-divider circuit setting and output a pre-divided signal; a pre-amplifier operable to pre-amplify the pre-divided signal and output a pre-amplified signal; a post-divider circuit operable to post-divide the pre-amplified signal according to a post-divider circuit setting; an analog-to-digital converter (ADC) operable to generate a digital data stream from the post-divided signal; and logic operable to: sample the digital data stream; determine a pre-divider circuit setting and a post-divider circuit setting based on the sampled data stream; set the pre-divider circuit and the post-divider circuit based on the determined settings; and generate a received signal strength value based on the pre-divider circuit setting and the post-divider circuit setting.

In some implementations, a method of automatic gain control (AGC) performed by an AGC circuit comprises: pre-dividing, by a pre-divider circuit, an input signal according to a pre-divider circuit setting and outputting a pre-divided signal; pre-amplifying, by a pre-amplifier, the pre-divided signal and outputting a pre-amplified signal; post-dividing, by a post-divider circuit, the pre-amplified signal according to a post-divider circuit setting; generating, by an analog-to-digital converter (ADC), a digital data stream from the post-divided signal; sampling the digital data stream; determining a pre-divider circuit setting and a post-divider circuit setting based on the sampled data stream; setting the pre-divider circuit and the post-divider circuit based on the determined settings; and generating a received signal strength value based on the pre-divider circuit setting and the post-divider circuit setting.

DETAILED DESCRIPTION

Example System

Figure 1:
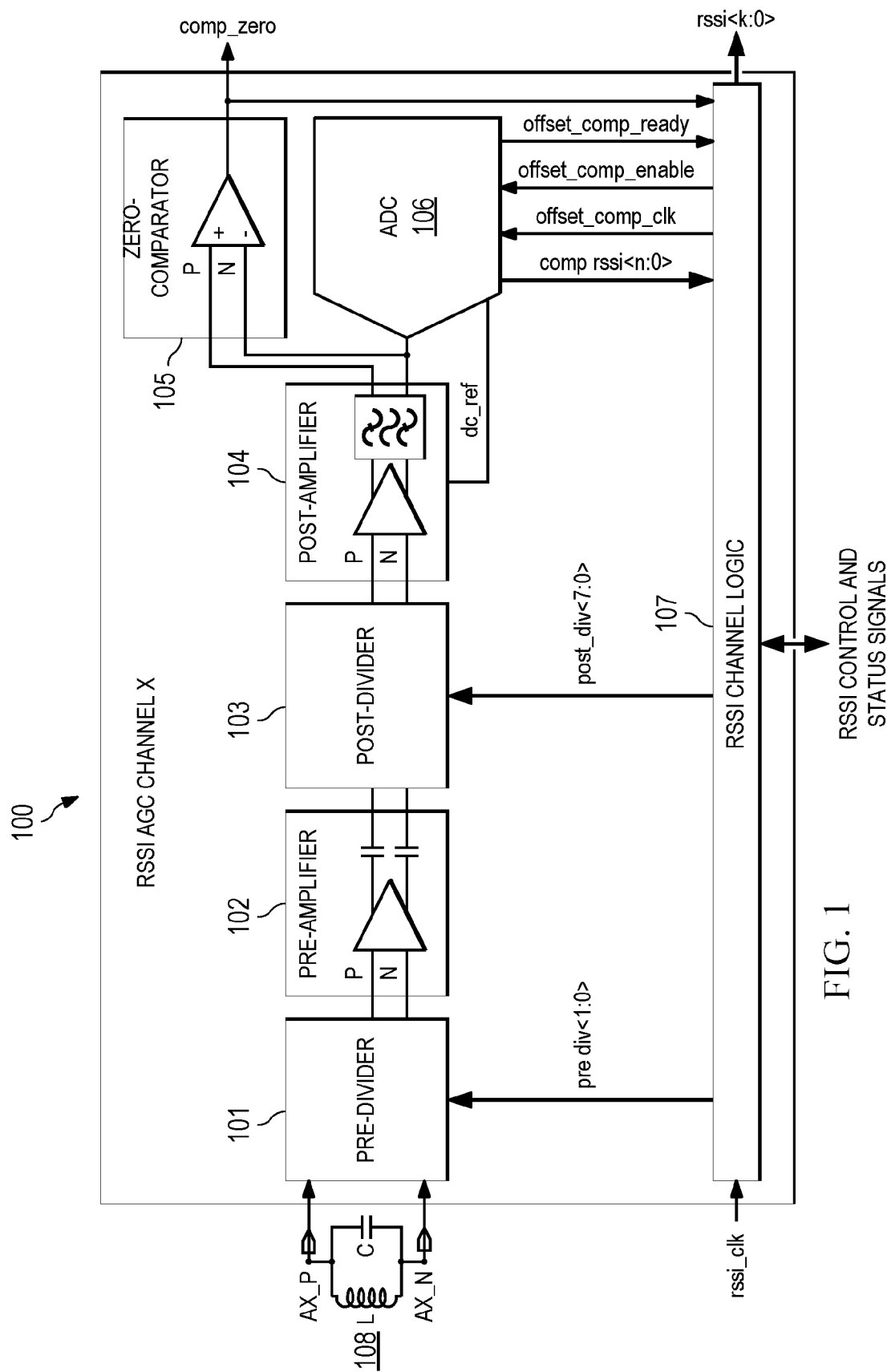
FIG. 1 is a block diagram of an example AGC circuit for RSSI, according to an embodiment.

FIG. 1 is a block diagram of an example digital AGC circuit 100 for received RSSI, according to an embodiment. AGC circuit 100 allows fast tracking of an envelope of CW input signals (AX_P, AX_N). AGC circuit 100 can be implemented in a single ended configuration or a symmetrical configuration. In the embodiment shown, AGC circuit 100 is implemented in a symmetrical configuration and AX_P, AX_N are positive (P) and negative (N) symmetrical CW input signals, respectively. In the figures that follow, only the P side of the circuitry is shown. For a symmetrical configuration the N side is complemented by mirroring the positive side circuitry at a ground line. AGC circuit 100 is for a single RSSI AGC channel X. In an embodiment, the CW input signals are transformed from an electro-magnetic or pure magnetic field by transducer 108, which can be, for example, an antenna or coil.

In an embodiment, AGC circuit 100 includes pre-divider circuit 101, pre-amplifier 102, post-divider circuit 103, post-amplifier 104, zero comparator 105, subranging ADC 106 and RSSI channel logic 107. Each of these components will be described in detail in the description that follows.

AGC circuit 100 provides several advantages over other systems and methods for generating RSSI values, including but not limited to: I) divider and amplifier partitioning into a chain of pre-divider, pre-amplifier, post-divider and post-amplifier to improve CNR and INL thus improving measurement accuracy; ii) the pre-divider tap is unchanged until the CW input signals reach a defined level so noise due to pre-divider attenuation is not increased while the CW input signals increase; iii) for low CW input signals, the pre-divider circuit includes a bypass setting so that low CW input signals are amplified prior to undergoing further voltage division by the post-divider circuit; iv) the pre-divider circuit operates directly at the coil and has a high impedance because it operates with a low number of taps that are loaded by parasitic capacitances; v) a higher degree of freedom to adjust circuit parameters for low noise and high linearity; vi)

a subranging ADC in the feedback path instead of feedback based on a comparator, which provides fast envelope tracking (fast measurement update rate) to allow averaging of more measurement values in the same measurement period resulting in better accuracy; vii) allows capture of an amplitude modulated signal; and viii) settling time duration is shorter and better defined.

Example Pre-Divider Circuit

Figure 2:
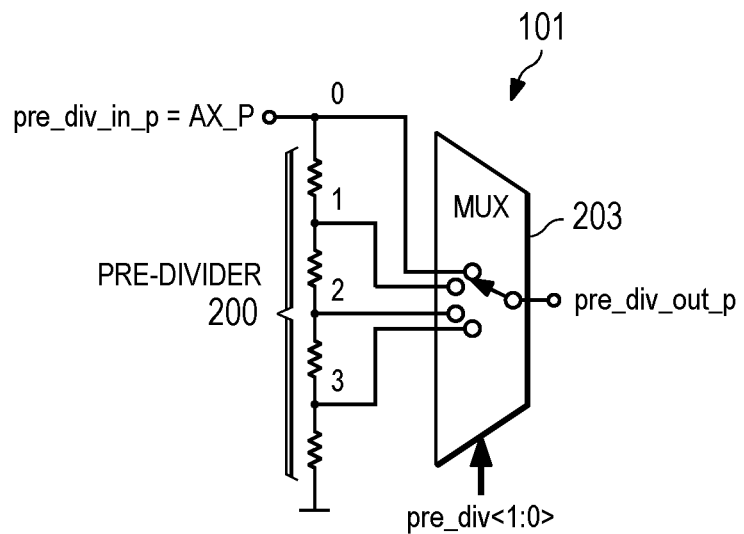
FIG. 2 is a schematic diagram of an example pre-divider circuit, according to an embodiment.

FIG. 2 is a schematic diagram of an example pre-divider circuit 101, according to an embodiment. Pre-divider circuit 101 attenuates a strong CW input signal using a resistive divider in a single ended or symmetrical configuration. For clarity of discussion, only the positive side for processing AX_P <pre_div in_p> is shown in FIG. 2. Pre-divider circuit 101 includes resistive divider 200 comprising a number of resistive elements coupled in series to provide 4 tap points, which are selectively coupled to the output of multiplexer (MUX) 203 by switches. In other embodiments, a capacitive divider or resistive/capacitive ladder network can be used to divide low frequency CW input signals and a PI or TEE attenuator can be used to divide high frequency CW input signals.

MUX 203 includes a series of switches and a decoder (not shown) that activates one tap point depending on a decoded setting (pre_div). In an embodiment, pre_div is a control word (pre_div<1:0>) provided by RSSI channel logic 107 in FIG. 1. MUX 203 also includes a bypass switch for bypassing the division of weak CW input signals. The output of MUX 203 (pre_div_out_p) is a divided AX_P or an undivided AX_P if pre-divider circuit 101 is configured in a bypass mode. Although resistive divider 200 is shown as including 4 tap points, any desired number of tap points can be used in resistive divider 200 by using an appropriate number of resistive elements and sizing pre_div accordingly. In some implementations, the range of attenuation is given by Equation [1]:

$$a\_prediv_{range} = \frac{V_{pre\_div\_out}}{V_{pre\_div\_in}}. \quad [1]$$

Example Pre Amplifier

Figure 3:
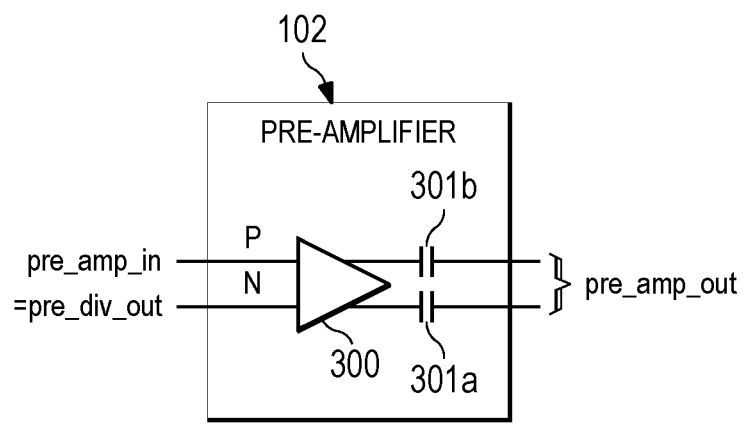
FIG. 3 is a schematic diagram of an example pre-amplifier circuit, according to an embodiment.

FIG. 3 is a schematic diagram of an example pre-amplifier 102, according to an embodiment. Pre-amplifier 102 is a low noise, high linearity gain amplifier that can be implemented in a single ended or symmetrical configuration. Pre-amplifier 102 can include one or more stages with fixed gain. The input impedance of pre-amplifier 102 can be matched to an antenna impedance to reduce noise. In an embodiment, pre-amplifier 102 can include an operational amplifier 300 and capacitors 301a, 301b coupled to the outputs of operational amplifier 300 to provide DC decoupling when pre-amplifier 102 is resistively loaded (e.g., by post-divider 103). For high frequency signals, pre-amplifier 300 can be replaced by a frequency conversion circuit. The pre-amplifier gain is given by Equation [2]:

$$Gain_{pre\_amp} = \frac{V_{pre\_amp\_out}}{V_{pre\_amp\_in}}. \quad [2]$$

Example Post-Divider Circuit

Figure 4:
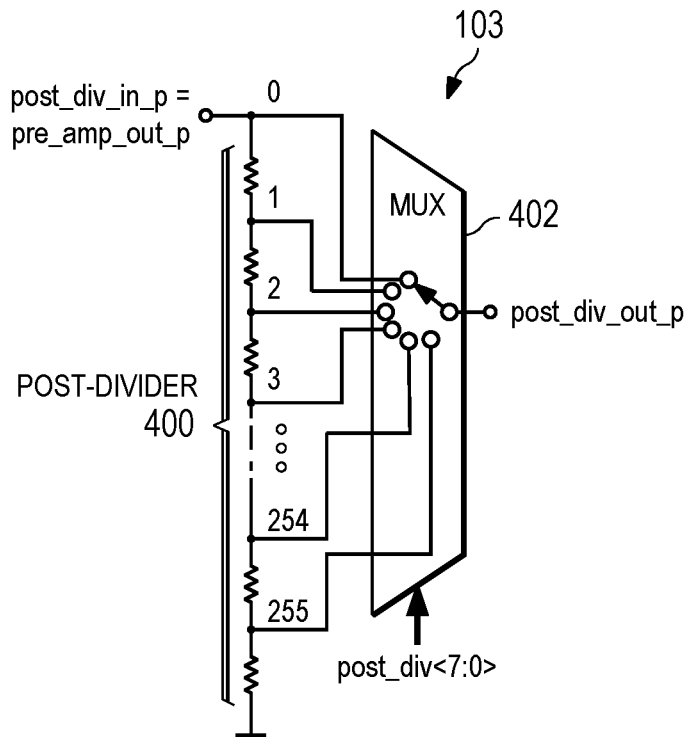
FIG. 4 is a schematic diagram of an example post-divider circuit, according to an embodiment.

FIG. 4 is a schematic diagram of an example post-divider circuit 103, according to an embodiment. Post-divider circuit 103 can be implemented in a single ended or symmetrical configuration. FIG. 4 shows only the P side circuitry. Post-divider circuit 103 attenuates the output of pre-amplifier 300 for measurement purposes using resistive divider 400. Resistive divider 400 includes a number of resistive elements coupled in series to provide 256 tap points, which are selectively coupled to the output of multiplexer (MUX) 402 by switches. A decoder in post-divider 103 (not shown) activates one tap point depending on setting post_div. In an embodiment, post_div can be a control word (post_div <7:0>) provided by RSSI channel logic 107. Post-divider circuit 103 also includes a bypass switch for bypassing weak CW input signals. In other embodiments, a capacitive divider, resistive/capacitive ladder network can be used to divide low frequency CW input signals and a PI or TEE attenuator can be used to divide high frequency CW input signals. Although resistive divider 400 is shown as including 256 taps, any desired number of taps can be used in resistive divider 200 by using an appropriate number of resistive elements and sizing the selection signal accordingly.

In an embodiment, a post-divider ratio $\alpha_{post\_div}$ can be determined by taking a logarithm of a ratio of the post-divider input voltage ($V_{post\_div\_in}$) and the post-divider output voltage ($V_{post\_out\_p}$), where the post-divider ratio $\alpha_{post\_div}$ is given by:

$$\alpha_{post\_div} = \frac{V_{post\_div\_out}}{V_{post\_div\_in}} = B^{-post\_div}, \quad [3]$$

$$post\_div = \log_B\left(\frac{V_{post\_div\_in}}{V_{post\_div\_out}}\right), \quad [4]$$

where base B determines the measurement resolution (e.g., B=1.02345). In another embodiment, other post-divider ratio can be used to achieve different measurement resolutions (e.g., cubic root).

Example Post-Amplifier Circuit

Figure 5:
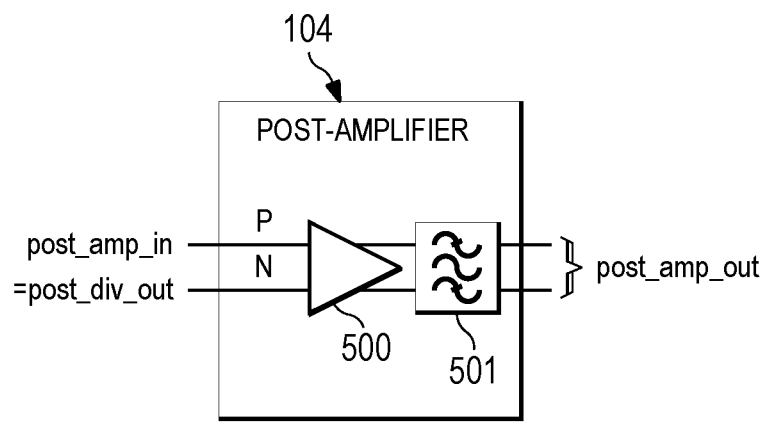
FIG. 5 is a schematic diagram of an example post-amplifier, according to an embodiment.

FIG. 5 is a schematic diagram of an example post-amplifier 104, according to an embodiment. Post-amplifier 104 is a low noise, high linearity gain amplifier that can be implemented in a single ended or symmetrical configuration. Post-amplifier 104 can include one or more stages with fixed gain. The input impedance of post-amplifier 104 can be matched to the post-divider impedance to reduce noise. In an embodiment, post-amplifier 104 can include operational amplifier 500 having an output coupled to band pass filter 501 to limit bandwidth to achieve low total root-mean-square (RMS) noise. Band pass filter 501 can be configured to exhibit low group delay to allow fast operation of the AGC loop. Band pass filter 501 can be located in its own block or distributed into gain stages by resistive-capacitive (RC) loading (low pass) and capacitive series feedback (high pass). The post-amplifier gain is given by Equation [5]:

$$Gain_{post\_amp} = \frac{V_{post\_amp\_out}}{V_{post\_amp\_in}}. \quad [5]$$

Example Subranging ADC and Zero-Comparator Circuit

Figure 6:
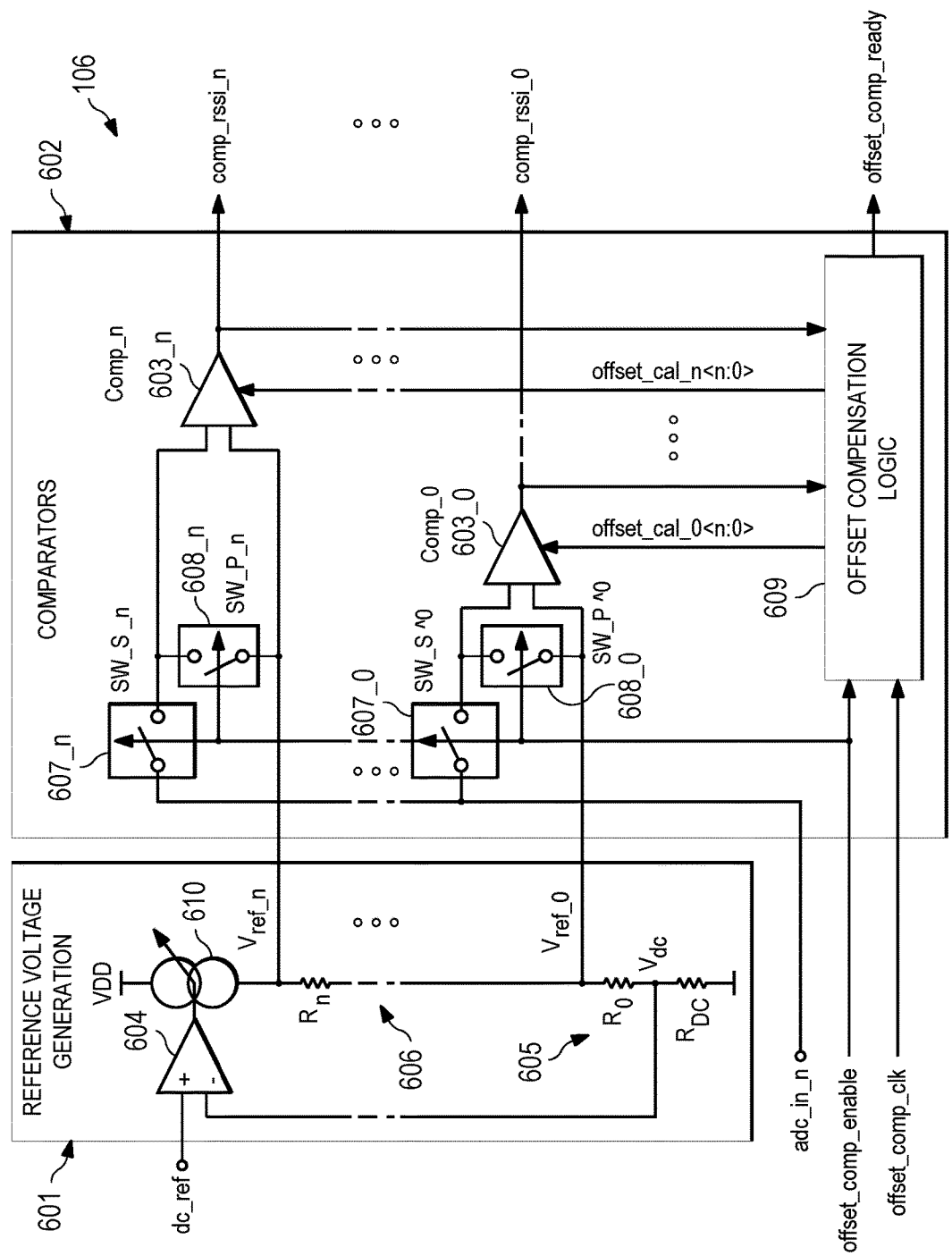
FIG. 6 is a schematic diagram of an example subranging analog-to-digital converter (ADC), according to an embodiment.

FIG. 6 is a schematic diagram of an example subranging analog-to-digital converter (ADC) 106, according to an embodiment. In the embodiment shown, ADC 106 is a 5-bit flash ADC with automated offset compensation. In another embodiment, a successive approximation (SAR) ADC can be used. In the embodiment shown, ADC 106 operates in a unipolar configuration to reduce chip size by reducing the number of components (e.g., comparators). In another embodiment, a bipolar configuration can be used. In the embodiment shown, ADC 106 is DC coupled to preceding post-amplifier 104. In another embodiment, ADC 106 and post-amplifier 104 can be DC decoupled.

Referring to FIG. 6, ADC 106 includes reference voltage stage 601 and comparator stage 602. Reference voltage stage 601 generates reference voltages (Vref_0-Vref_n) for comparators 603_0 to 603_n (e.g., n=31) in comparator stage 602. In the example embodiment of FIG. 6, there are n+1 comparators and only comparator 603_0 and comparator 603_n are shown. Reference voltage stage 601 includes operational amplifier 604 with a non-inverting input coupled to a DC reference (dc_ref) and an inverting input coupled to an offset voltage (VDC) that occurs across resistor 605 (RDC). The voltage output of operational amplifier 604 steers a voltage controlled current source 610 that acts on resistive ladder 606, which includes resistive elements R0 . . . Rn (e.g., R0-R31) to generate reference voltages and resistor 605 to generate the offset voltage VDC that is controlled in a feedback loop.

A first input of each of comparators 603_0 to 603_n is coupled to the ADC input (adc_in_n) by corresponding series switches 607_0 to 607_n. A second input of each comparator 603_0 to 603_n is coupled to a tap point of resistive ladder 606. Series switches 607_0 to 607_n are controlled by an offset compensation enable signal (offset_comp_enable) generated by RSSI channel logic 107. Parallel switches 608_0 to 608_n couple the inputs of comparators 603_0 to 603_n together, resulting in offset voltages to appear at the outputs of comparators 603_0 to 603_n. The outputs of comparators 603_0 to 603_n are compensated RSSI values (comp_rssi_0 to comp_rssi_n), which are input into offset compensation logic 609.

In an embodiment, offset compensation logic 609 includes circuitry for generating offset calibration signals (offset_cal_0 to offset_cal_n) for comparators 603_0 to 603_n based on the compensated RSSI values (comp_rssi_0 to comp_rssi_n) received from the outputs of comparators 603_0 to 603_n. For example, during an offset compensation mode, series switches 607_0 to 607_n are opened to disconnect comparators 603_0 to 603_n from the ADC input (adc_in_n) and parallel switches 608_0 to 608_n are closed to short together inputs of comparators 603_0 to 603_n. This causes voltage offsets to appear at the outputs of comparators 603_0 to 603_n. The voltage offsets are input to offset compensation logic 609, which includes circuitry for generating and providing offset calibration values (offset_cal_0 to offset_cal_n) based on the voltage offsets. The offset calibration values are used to compensate for the offset voltages. When offset compensation is completed, offset compensation logic 609 generates an offset compensation ready signal (offset_comp_ready), which is sent to RSSI channel logic 107, as shown in FIG. 1. Offset compensation logic 609 is coupled to an offset compensation clock (offset_comp_clk) generated by RSSI channel logic 107.

Figure 7:
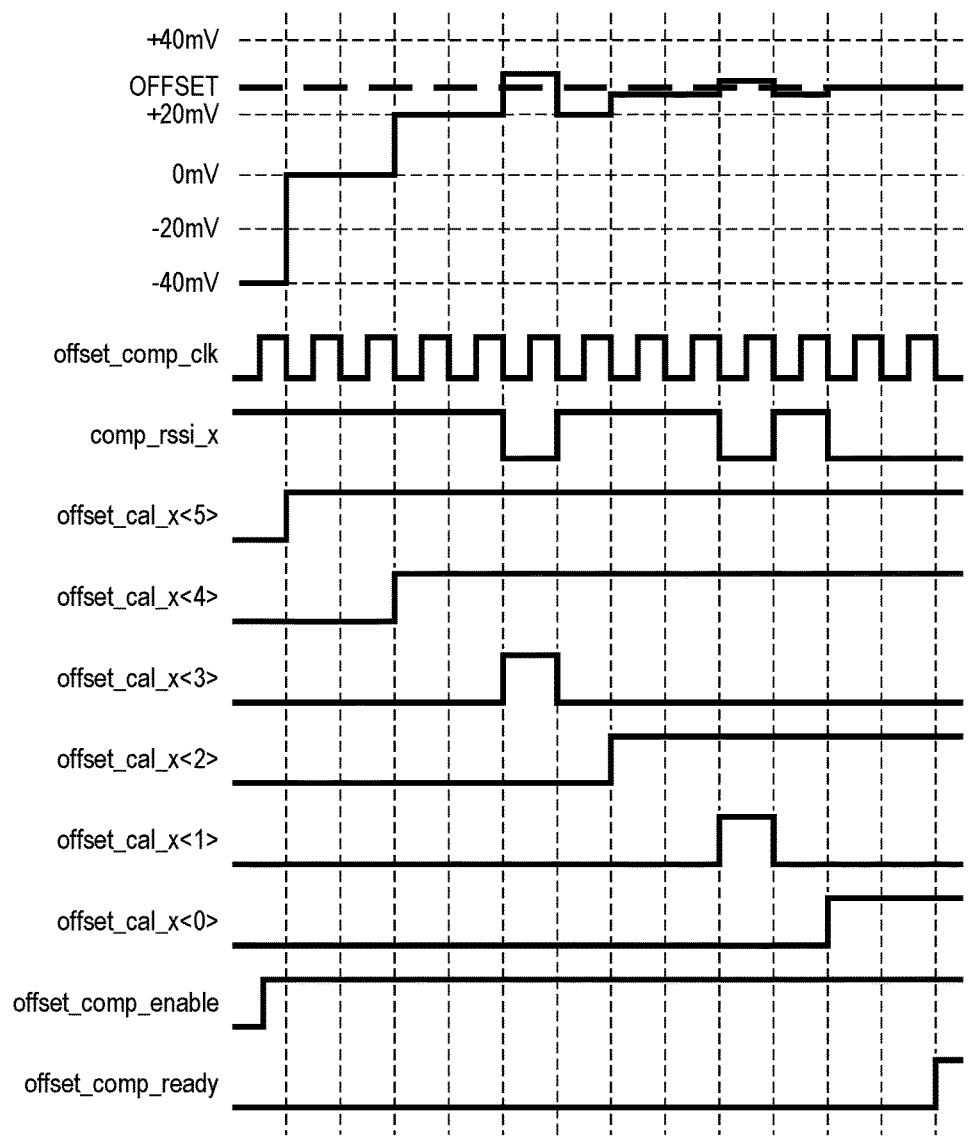
FIG. 7 illustrates example waveforms of the subranging ADC of FIG. 6 operating in an automatic offset compensation mode, according to an embodiment.

FIG. 7 illustrates example waveforms related to the automated offset compensation mode, according to an embodiment. Before any measurement can be started an offset compensation is carried out by disabling the inputs of comparators 603_0 to 603_n from adc_in_n by series switches 607_0 to 606_n and connecting for each comparator 603_0 to 603_n both inputs to Vref_x by parallel switches 608_0 to 608_n via signal offset_comp_enable. Each of comparators 603_0 to 603_n has the ability to program an artificial offset voltage between its inputs within a certain range (e.g., +/−40 mV) by enforcing an imbalance via signal offset_cal_x<n:0>. The step width of the artificial offset voltage is binary weighted (e.g., 40, 20, 10, 5, 2.5 and 1.25 mV). Offset compensation logic 609 controls the compensation process flow using a successive approximation procedure that is activated by signal offset_comp_enable. For each comparator 603_0 to 603_n the largest step is activated with the first falling edge of signal offset_comp_clk (e.g., via offset_cal_x<5>). The second falling edge offset_cal_x<5> is kept high if comparator output stays logically high, otherwise it is set back to logically low and the state of offset_cal_x<5> is latched until offset_comp_ready is cleared. This offset compensation procedure is repeated for the next lower offset_cal_x bits in a sequential manner. If all offset_cal_x bits are processed signal flag offset_comp_ready is set.

Figure 8:
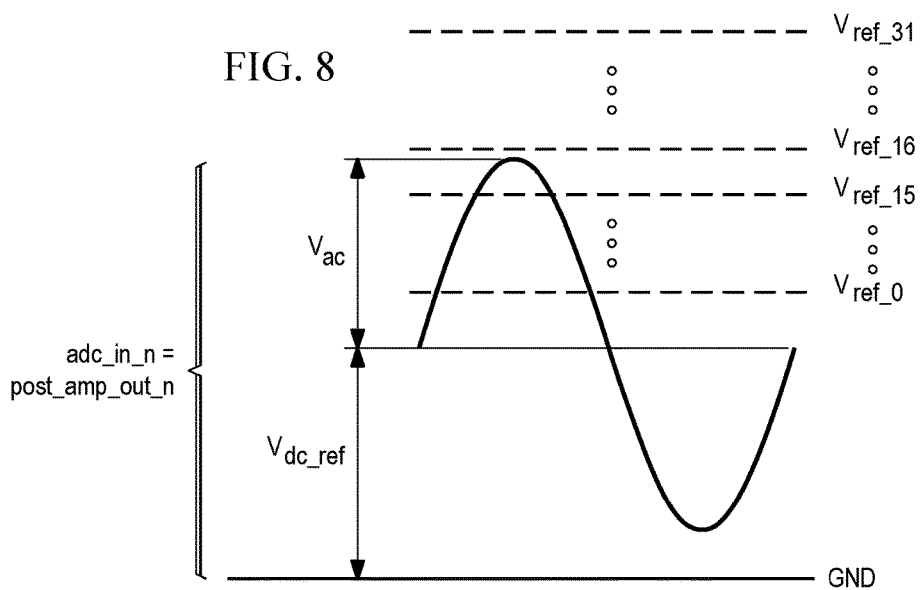
FIGS. 8 and 9 illustrate an example operating mode of the subranging ADC of FIG. 6 after an automatic offset compensation process, according to an embodiment.
Figure 9:
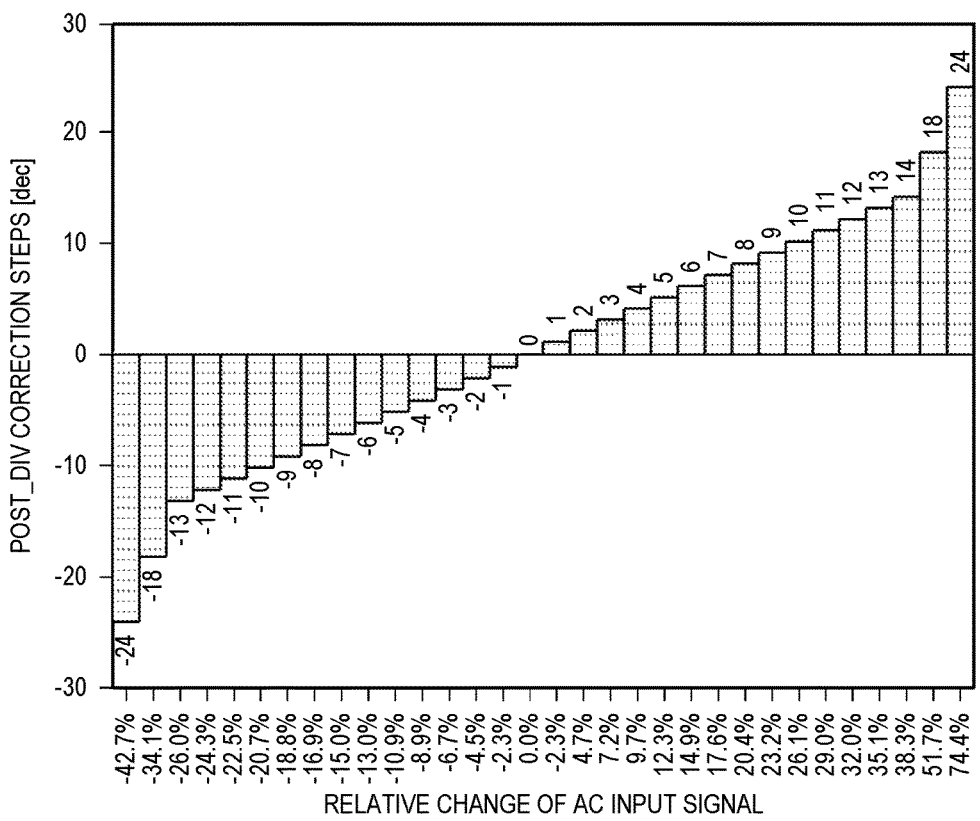

FIGS. 8 and 9 illustrate an example operating mode of subranging ADC 106 of FIG. 6 after an offset compensation process, according to an embodiment. In operating mode after offset compensation process has finished shorted parallel switches 608_0 to 608_n are opened and series switches 607_0 to 607_n are closed. All comparators 603_0 to 603_n where reference voltages Vref_0 to Vref_n are exceeded by the amplitude of input signal adc_in_n are set to logical high. In an embodiment, the comparator output signals comp_rssi<n:0> are a quantized data stream of thermometer codes related to the instantaneous amplitude value of adc_in_n (quantization only). Sampling of the thermometer codes is performed in RSSI channel logic 107.

Reference voltage stage 601 includes voltage controlled current source 609 that feeds resistive ladder 606 and operational amplifier 604 that operates in a feedback loop. Vdc across a lowest resistor R0 is sensed and compared to Vdc_ref that is provided by post-amplifier 104 via signal input dc_ref. The voltage difference between both potentials controls current source 610 in a way that after a settling time operating current will produce a voltage drop across resistor $R_{DC}$ with Vdc=Vdc_ref. The reference voltages Vref_x are based on this operating current and the divider ratios for different tap points. The divider ratios are chosen to match to post-divider ratios (e.g., a logarithmic type). In this embodiment, using a 5-bit subranging ADC 106 at Vref_15, the AGC loop operates in its equilibrium state where no post-divider correction occurs:

$$V_{ac}=V_{ac\_eq}=V_{ref\_15}-V_{dc_{ref}}. \qquad [6]$$

The divider ratio is derived from the relative change of the CW input signal:

$$\Delta V_{ac\_rel_x} = \frac{V_{ref\_x} - V_{ref\_15}}{V_{ac\_eq}} = B^{post\_div\_corr\_x}, \qquad [7]$$

with base B is the value chosen for post-divider circuit 103 (e.g., B=1.02345 e.g.).

For AC voltages beyond AGC loop equilibrium post-divider correction is linear stepped if Vac is close to equilibrium for accuracy reasons and nonlinear stepped for speed reasons. Referring to FIGS. 8 and 9, example post-divider correction words are given by Equation [8]:

$$\text{post\_div\_corr}_x = \begin{cases} -24 & x = 0 \\ -18 & x = 1 \\ \pm(x-15) & \text{for } 2 \leq x \leq 29, \\ 18 & x = 30 \\ 24 & x = 31 \end{cases} \quad [8]$$

with x=15 being the equilibrium state in this example.

The post-divider correction word (post_div_corr) is calculated in RSSI channel logic 107 based on signal comp_rssi<31:0> (assuming 32 comparators) delivered from subranging ADC 106, but has been introduced here to make the overall functionality of AGC circuit 100 more clear.

Figure 10:
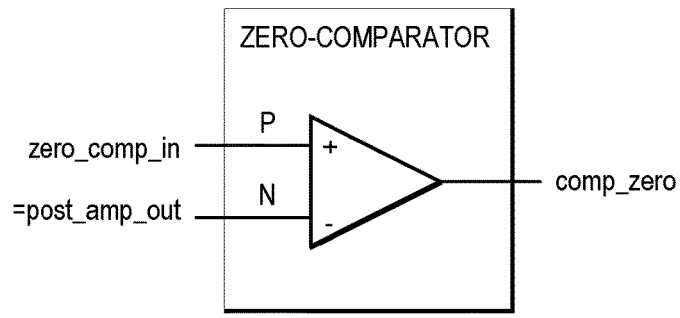
FIGS. 10-11 illustrate an example zero comparator, according to an embodiment.
Figure 11:
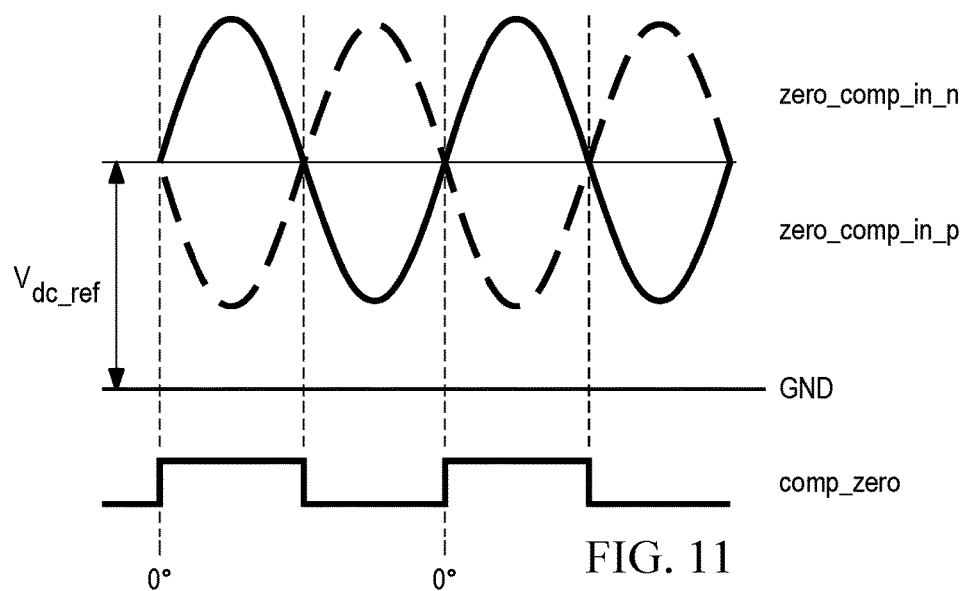

FIG. 10 illustrates an example zero-comparator 105, according to an embodiment. Parallel to subranging ADC comparators 603_0-603_n is zero-comparator 105 offset compensated before any measurement can be started (not shown). During operation symmetrical AC output signal of post-amplifier 104 is connected to P and N inputs of zero-comparator 105, as shown in FIG. 1. The positive edge of output signal comp_zero represents the zero phase of the symmetrical AC signal at its input, as shown in FIG. 11.

Example RSSI Channel Logic Circuit

Referring again to FIG. 1, RSSI channel logic 107 fulfills several functions within AGC circuit 100. RSSI channel logic 107 performs peak detection by sampling a quantized data stream comp_rssi<n:0> delivered from subranging ADC 106 and finding the peak value therein. RSSI channel logic 107 controls the settings of pre-divider circuit 101 and post-divider circuit 103 depending on the detected peak value. RSSI channel logic 107 calculates RSSI result words rssi<k:0> and streams the RSSI result words to results registers or further calculation units (e.g., averaging units). RSSI channel logic 107 provides clocks derived from master clock rssi_clk (e.g., offset_comp_clk). RSSI channel logic 107 includes a state machine to control overall measurement flow, provide correction procedure and handle communication to a master state machine.

Figure 12:
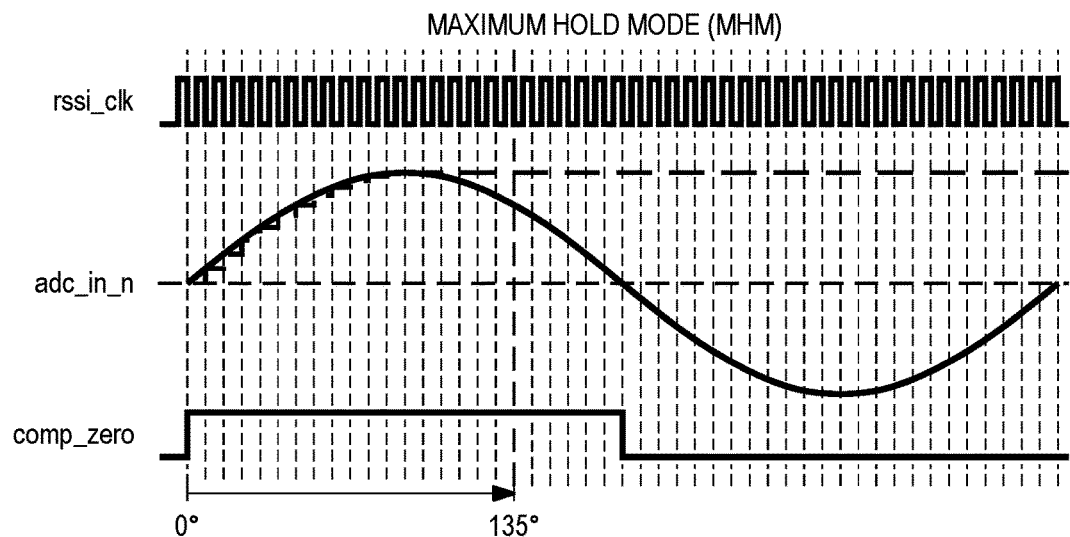
FIGS. 12-20 illustrate example digital control circuit, according to an embodiment.
Figure 13:
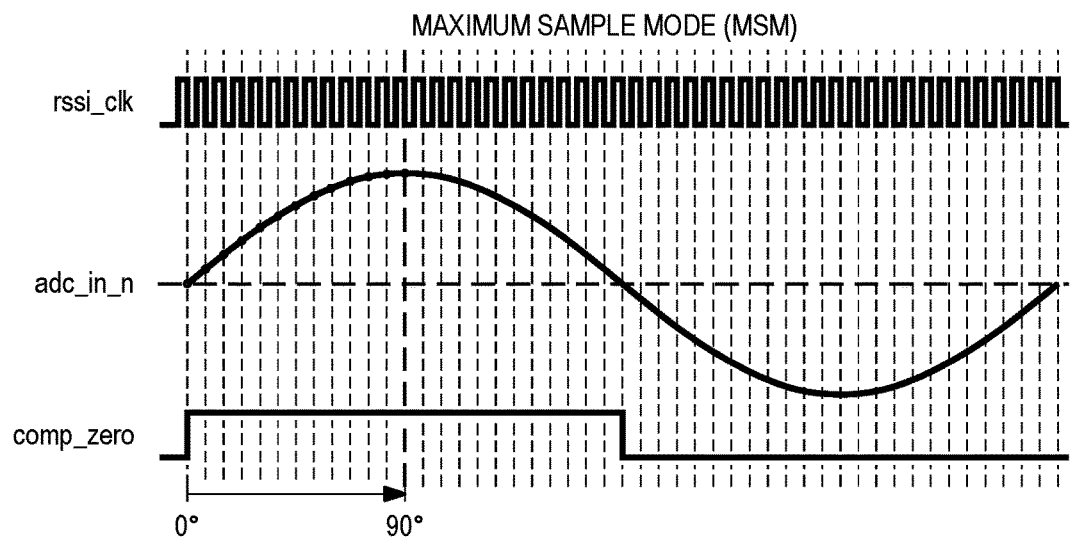
Figure 14:
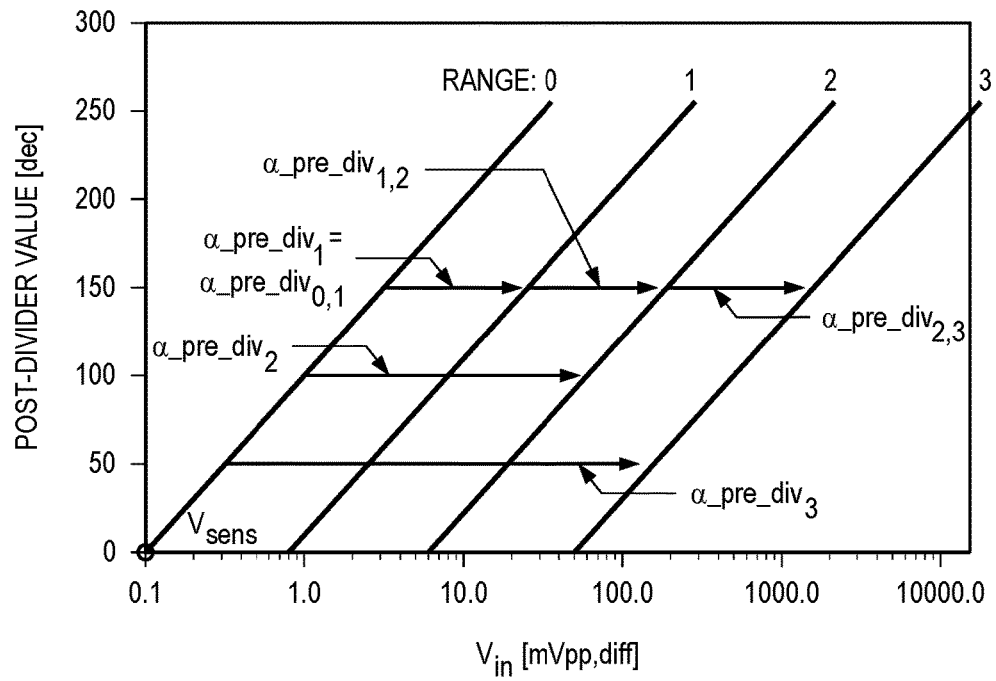

FIGS. 12 and 13 illustrate example peak detection performed by RSSI channel logic 107 of FIG. 1, according to an embodiment. RSSI channel logic 107 samples the quantized data stream comp_rssi and finds the peak value therein. Note that to make the peak detection procedure more clear, FIGS. 12 and 13 show a continuous sine wave on adc_in_n instead of a quantized data stream on comp_rssi at the output of ADC 106 where sampling actually occurs. The 0° of the continuous sine wave at adc_in_n is indicated in FIGS. 12 and 13 by a positive edge of comp_zero. Other phases of the sine wave at adc_in_n can be determined by counting clock edges of rssi_clk. For example, with a 125 kHz sine wave and a 6 MHz clock the 13th and 19th negative edge of rssi_clk corresponds to time points 90° and 135°. In a maximum hold mode (MHM), envelope or non-coherent detection is performed. Starting from 0° until 135° at each negative edge of rssi_clk the highest bits of comp_rssi showing a logical high will be latched. The last sample taken indicates the peak value. In a maximum sample mode (MSM), quasi coherent detection is performed. At 90° a sample of comp_rssi will be taken and the highest bit with a logical high indicates peak value. Both modes allow for divider change within one period of the sine wave if calculation delay and analog settling (group delay)<270° (MSM)/225° (MHM).

Detected peak values will be converted into post-divider correction values (post_div_corr) according to Equation [8] and added together from sample measurement to sample measurement to evaluate the post_div word that adjusts post-divider 103:

$$\text{post\_div}_i = \Sigma_i \text{post\_div\_corr}_i \quad [9]$$

with i being the number of sample measurements and initial condition post_div_corr$_0$=0.

FIGS. 14-17 illustrate an example static operation of divider control performed by RSSI channel logic of FIG. 1, according to an embodiment. With logarithmic AGC loop in equilibrium the transfer function of Vin to Vac_eq can be solved and reordered for post_div value that depends on range setting of pre-divider 101 using Equations [1]-[3] and [5]:

$$\text{post\_div}_{range} = \log_B\left(\frac{V_{in} \cdot \text{a\_pre\_div}_{range} \cdot Gain_{pre\_amp} \cdot Gain_{post\_amp}}{V_{ac\_eq}}\right), \quad [10]$$

with $0 \leq \text{post\_div}_{range} \leq 255$ and $0 \leq \text{range} \leq 3$.

With the sensitivity defined as smallest detectable voltage Equation [11] gives:

$$V_{sens} = \frac{V_{ac\_eq}}{Gain_{pre\_amp} \cdot Gain_{post\_amp}}. \quad [11]$$

With the pre-divider ratio expressed as a shift of post-divider value, Equation [12] gives:

$$\text{pre\_div}_{range} = \log_B\left(\frac{1}{\text{a\_pre\_div}_{range}}\right). \quad [12]$$

Or expressed as a relative shift from one range to a next range Equation [13] gives:

$$\text{pre\_div}_{range} = \text{pre\_div}_{0,1} + \ldots + \text{pre\_div}_{(range-1),range}. \quad [13]$$

Figure 15:
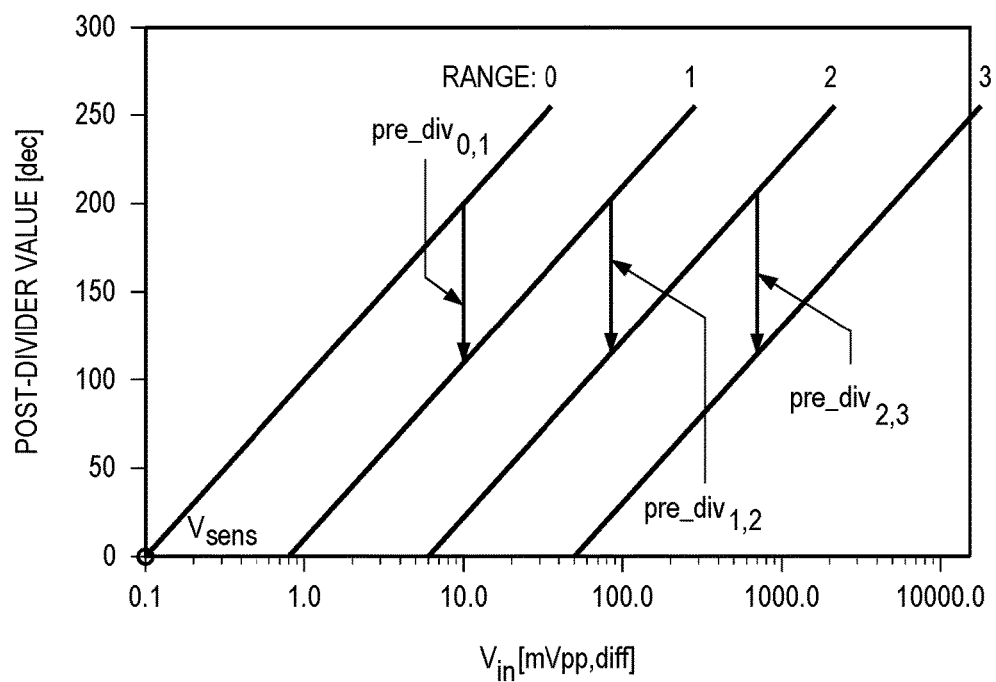

Due to post-divider curve overlap for certain V$_{in}$ values a calibration procedure is able to find initially unknown pre-divider ratios by measuring post_div values while keeping V$_{in}$ constant and forcing the range setting to range and (range-1) successively as shown in FIG. 15:

$$\text{pre\_div}_{(range-1),range} = \text{post\_div}_{range} - \text{post\_div}_{(range-1)}. \quad [14]$$

Although the physical pre-divider ratio remains unchanged by this calibration procedure it is useful for calculating correct RSSI words from post_div and calibrated pre_div words as described in further detail below.

Figure 16:
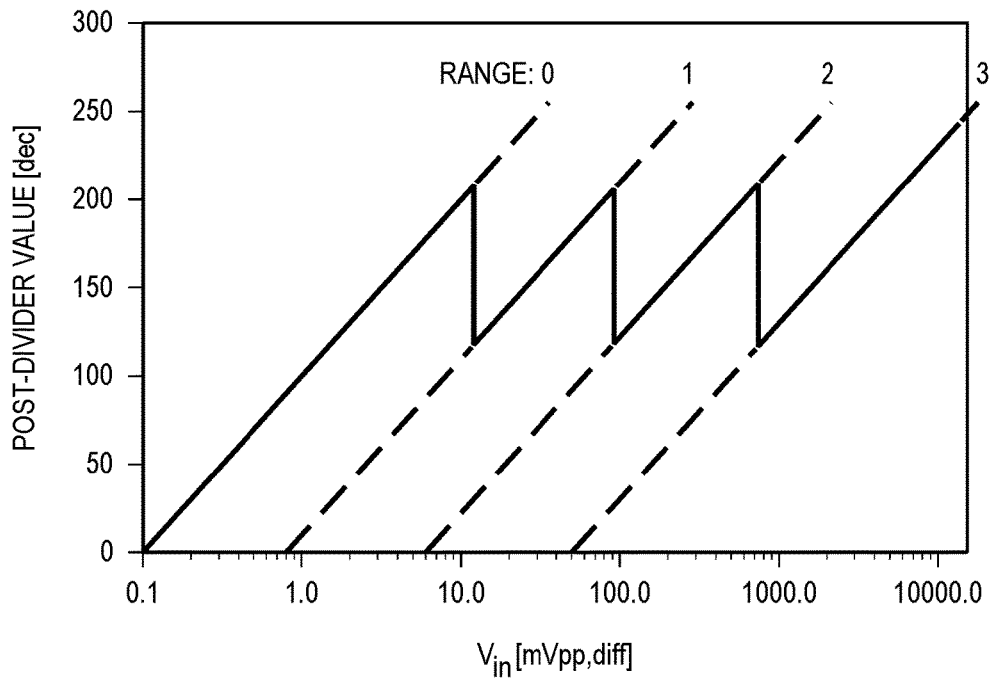
Figure 17:
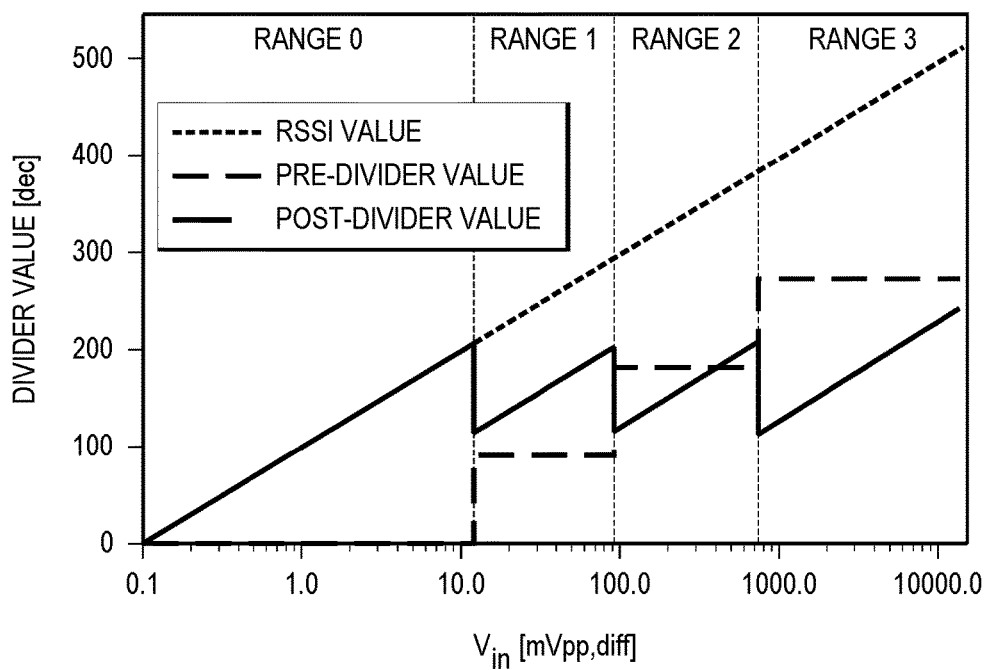

Due to post-divider curve overlap there is also a certain flexibility when to change from (range-1) to actual range and can be used to operate on the most accurate part of the post divider curve. For small post_div values (<100) strong noise influence by the resistive divider occurs. To prevent distortion due to the pre-divider switching the ranges can be changed only during a short tracking period (initial settling of AGC) and in rising direction for Vin changes, afterwards post-divider can act on curve defined by the range setting. In FIG. 16, when post_div value exceeds 207 to achieve equilibrium in range 1, pre_div is changed by 1 step thus reducing post_div by 89 steps. After AGC settling, post_div is acting on a fixed curve giving a headroom of 48 steps upwards and 118 steps downward for any Vin changes during capture phase. The RSSI value is calculated from post_div, range and pre_div according to Equation [15]:

$$rssi = \begin{cases} post\_div & range = 0 \\ post\_div + \sum_{i=1}^{range} pre\_div_{(i-1),i} & range > 0 \end{cases}. \quad [15]$$

Figure 18:
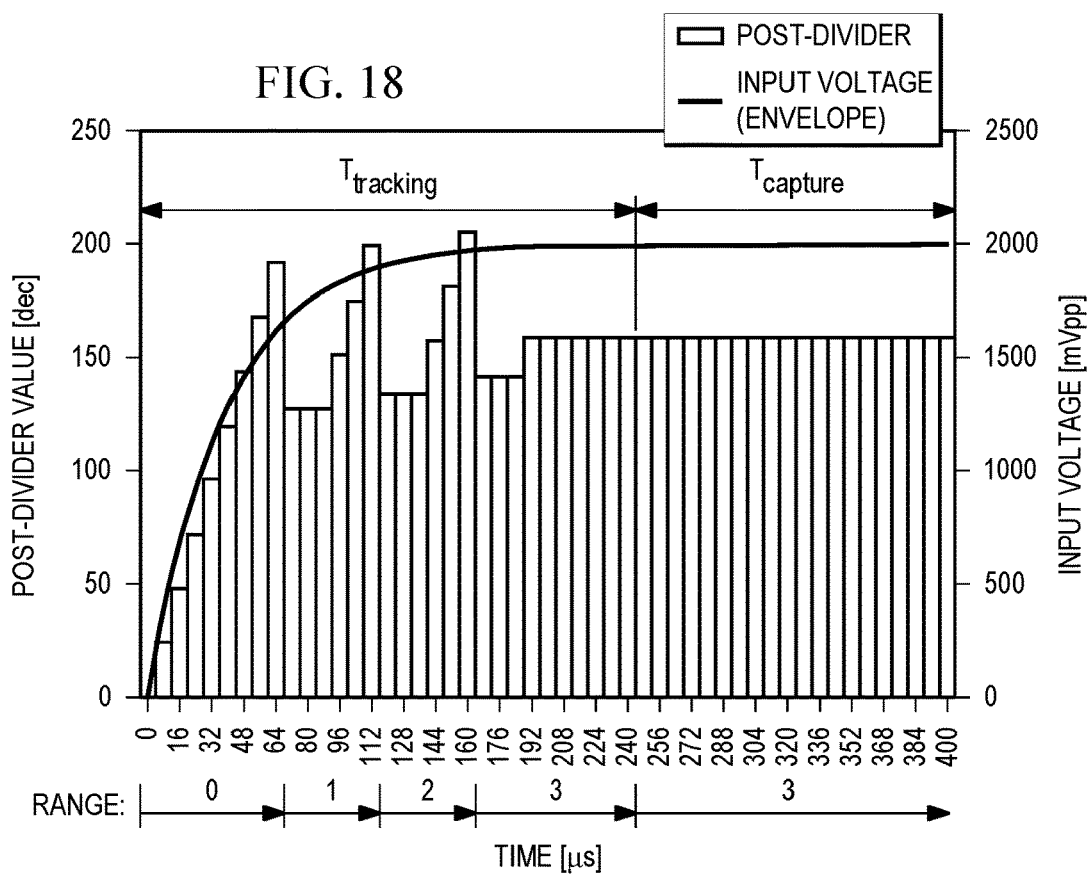
Figure 19:
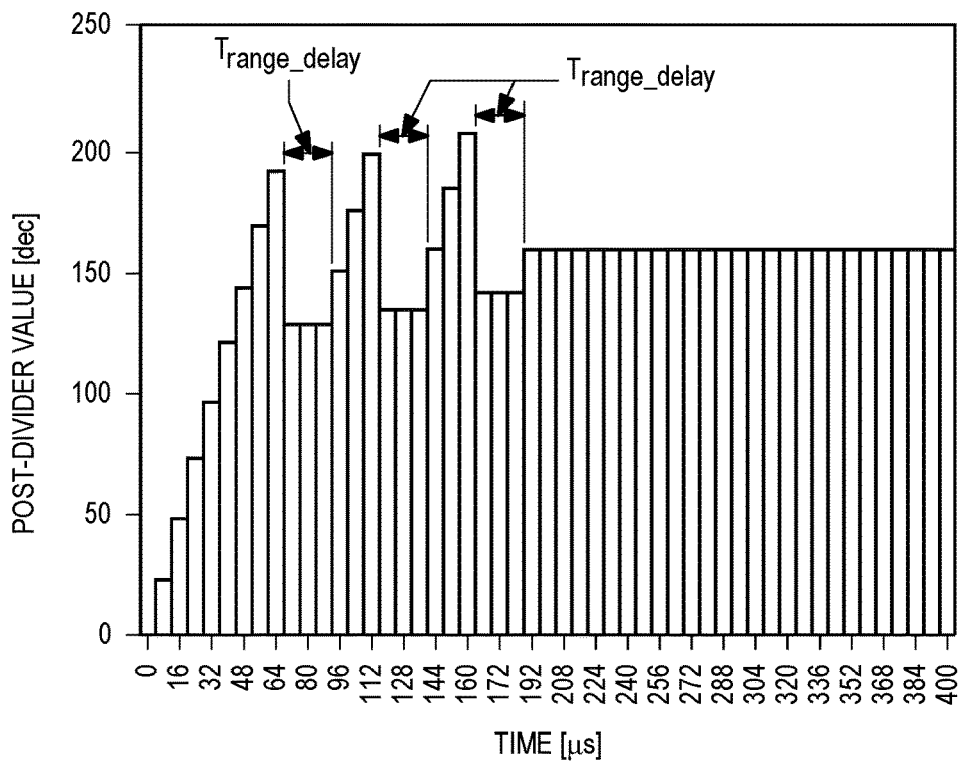

FIGS. 18-19 illustrate an example dynamic operation of divider control performed by RSSI channel logic 107 of FIG. 1, according to an embodiment. The AGC principle is dedicated to measure the envelope of bursted AC input voltages. During programmable tracking time ($T_{tracking}$) the AGC circuit tries to follow the envelope's rising edge thereby changing the post-divider value and range setting accordingly to an instantaneous peak amplitude of the input voltage. After any range change has occurred a programmable wait time ($T_{range\_delay}$) keeps the divider settings unchanged so that the analog circuitry within the AGC loop settles before any new divider settings can be performed. If bursted AC input voltage has become a stable continuous wave signal (CW) capturing of momentary RSSI values starts within a programmable length ($T_{capture}$) for further processing (e.g., averaging). During capture time the last range setting of the tracking phase will be kept constant and only post-divider 103 is working to refresh RSSI values.

Figure 20:
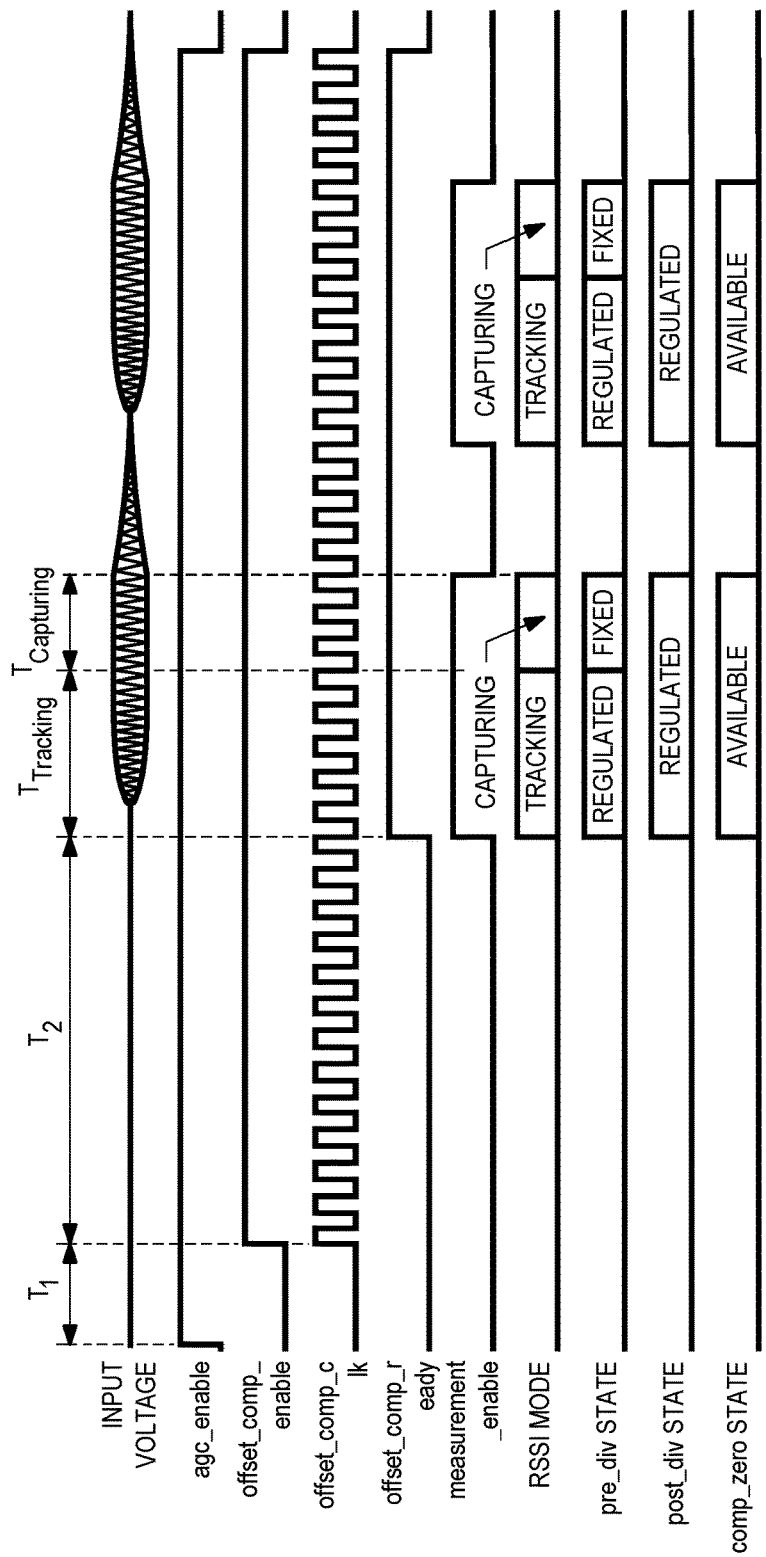

FIG. 20 illustrates an example state machine implemented by RSSI channel logic 107 of FIG. 1, according to an embodiment. With signal agc_enable AGC circuit 100 will be started. After a wait time T1 for settling of the analog part (e.g., amplifier, filter, etc.) offset compensation can be started via signal offset_comp_enable. Clock offset_comp_clk that is derived from rssi_clk for offset compensation will be started. Within wait time T2 a successive approximation procedure is executed to compensate for offsets and its end is indicated by flag offset_comp_ready. With flag offset_com_ready set one or more measurements can be initiated by signal measurement_enable. If an AC voltage burst is active at AGC input AGC circuit 100 tracks its envelope during a tracking phase and takes samples of the envelope during a capturing phase. While both dividers can be regulated during the tracking phase, post-divider 103 can be regulated during the capture phase. Signal comp_zero is available during tracking and capturing time.

Performance

Figure 21:
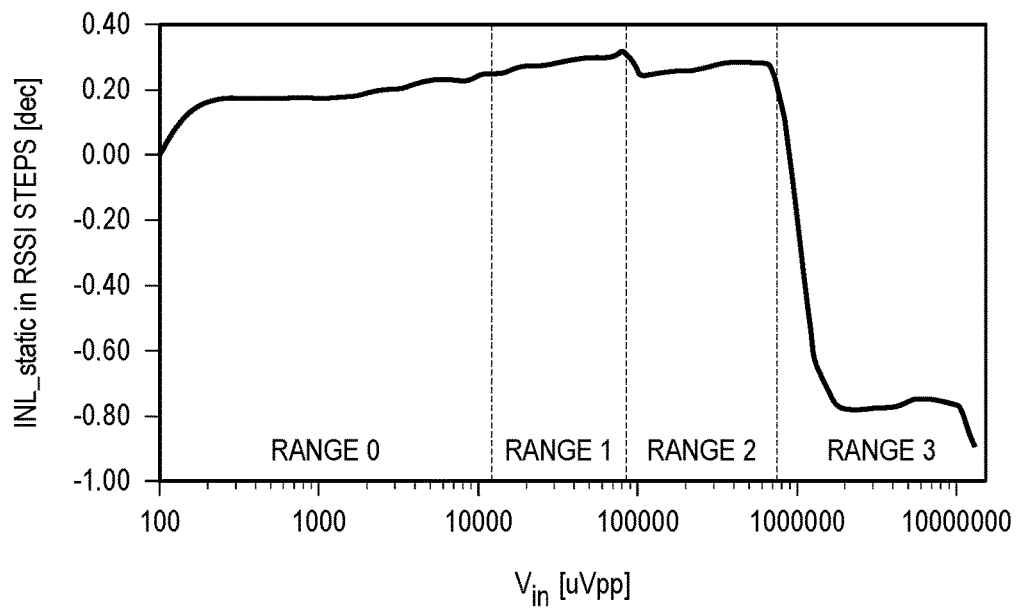
FIGS. 21-26 illustrate AGC circuit performance, according to an embodiment.
Figure 22:
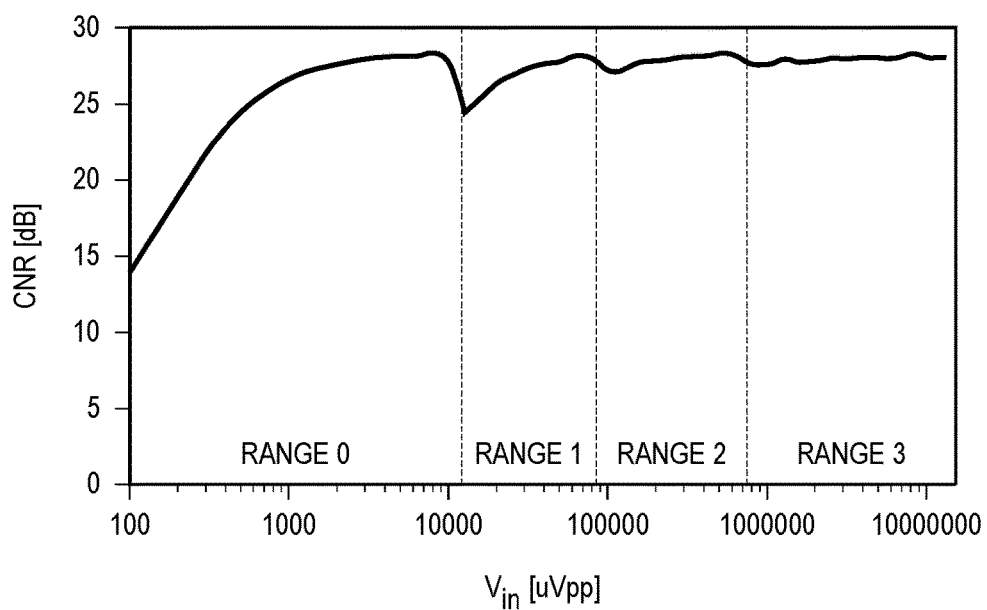

FIGS. 21-22 illustrate analog performance of AGC circuit 100, according to an embodiment. From input to post-amplifier output analog performance is determined as static integrated non-linearity (INL_static) and carrier-to-noise ratio (CNR) for a closed AGC loop in equilibrium. INL_static is defined as the deviation between a measured and an ideal calculated RSSI curve with noise effects excluded:

$$INL\_static = rssi_{measured} - rssi_{calc}. \quad [16]$$

CNR at the input of ADC 106 is defined as:

$$CNR = 20 \cdot \log_{10}\left(\frac{veff_{post\_amp\_out}(V_{in})}{V_{noise\_rms_{post\_amp\_out}}(V_{in})}\right), \quad [17]$$

with effective AC voltage and over frequency bandwidth integrated noise voltage density at post-amplifier output.

A typical curve for INL_static shows linearity error in RSSI steps<0.5 up to range 2 and <1 for range 3. A typical curve for CNR shows values ≥25 dB for input levels >600 µVpp.

Figure 23:
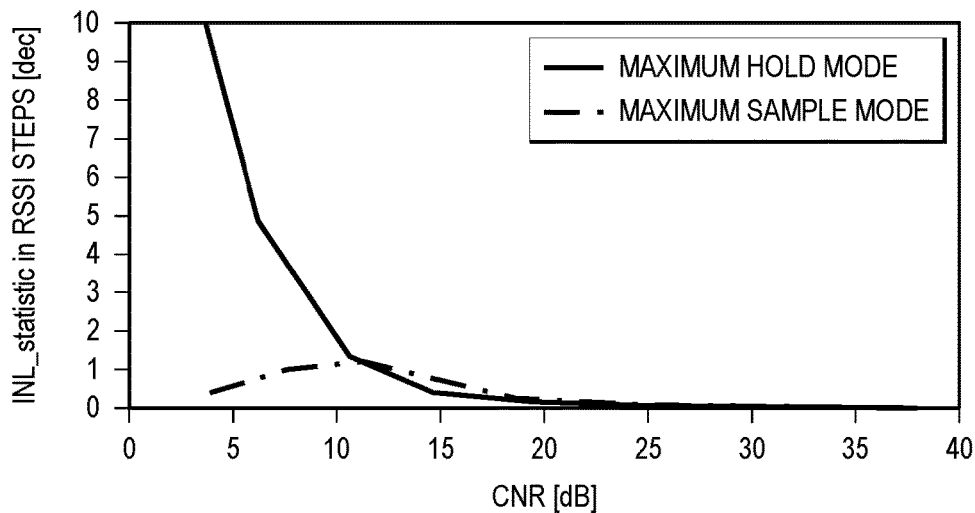
Figure 24:
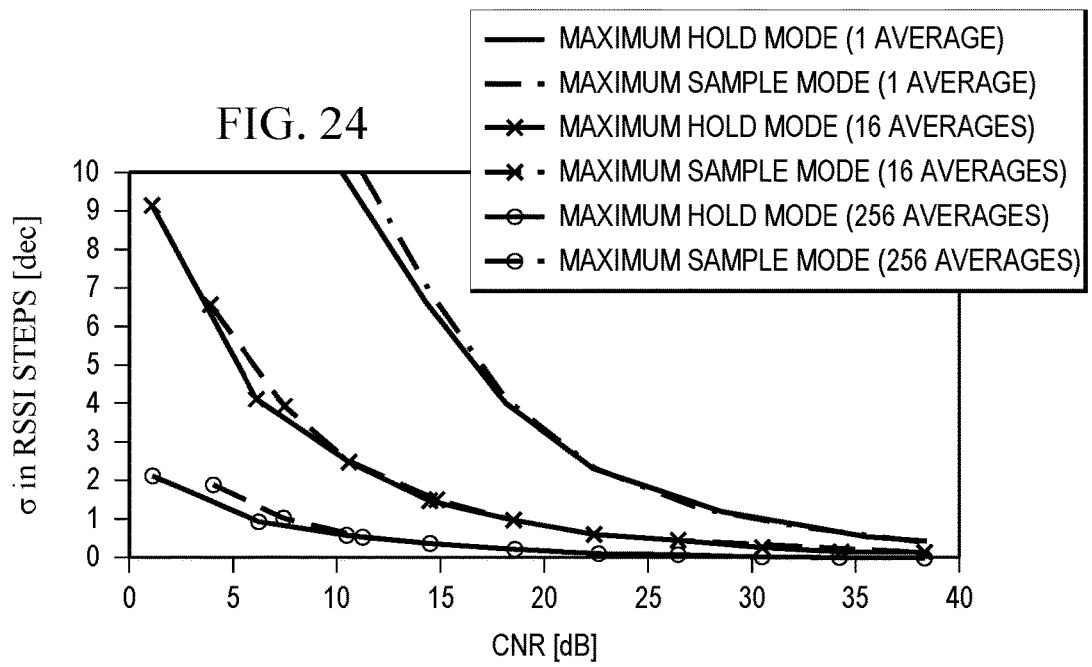

FIGS. 23-24 illustrate digital performance of AGC circuit 100, according to an embodiment. For a closed AGC loop in equilibrium RSSI values are simulated when CNR is varied at subranging ADC input and evaluated for median (INL_statistic) and variance ($\sigma$) with a spectral noise shape of the analog part and different numbers of averaging. Typical curves for INL_statistic do not show a dependency on the number of averages that have been used but there is a strong influence at low CNR values depending on the sampling method used. MHM mode shows a strong threshold effect for decreasing CNR starting from 15 dB similar to that what is known for non-coherent detection. Maximum sample mode (MSM) shows a much weaker increase of INL_statistic that occurs due to nonlinear compression of logarithmic rssi curve when driven by strong noise fluctuations. Typical curves for a show an improvement with increasing CNR and increasing number of averages that have been used but there is nearly no influence by the sampling method used.

Figure 25:
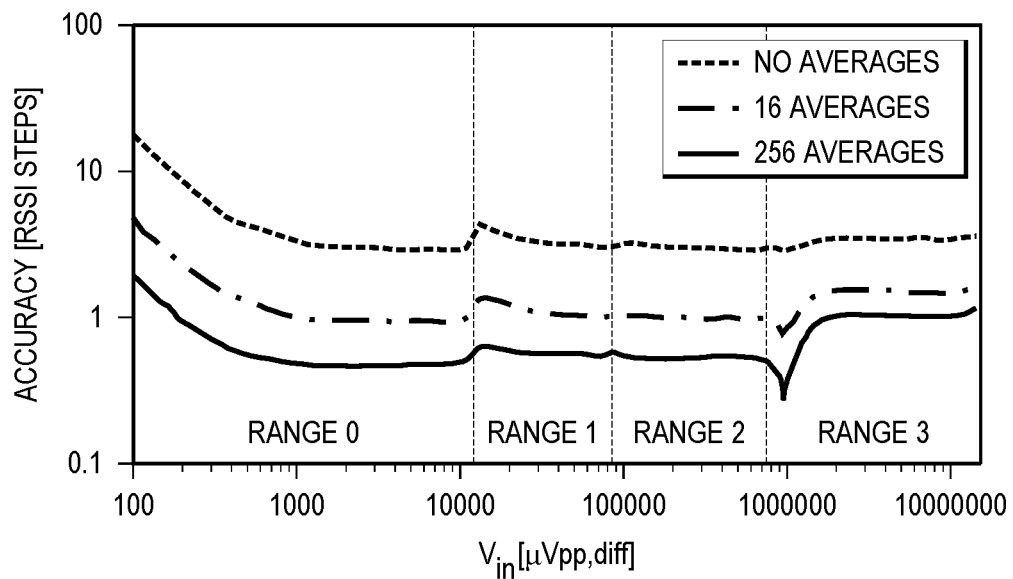
Figure 26:
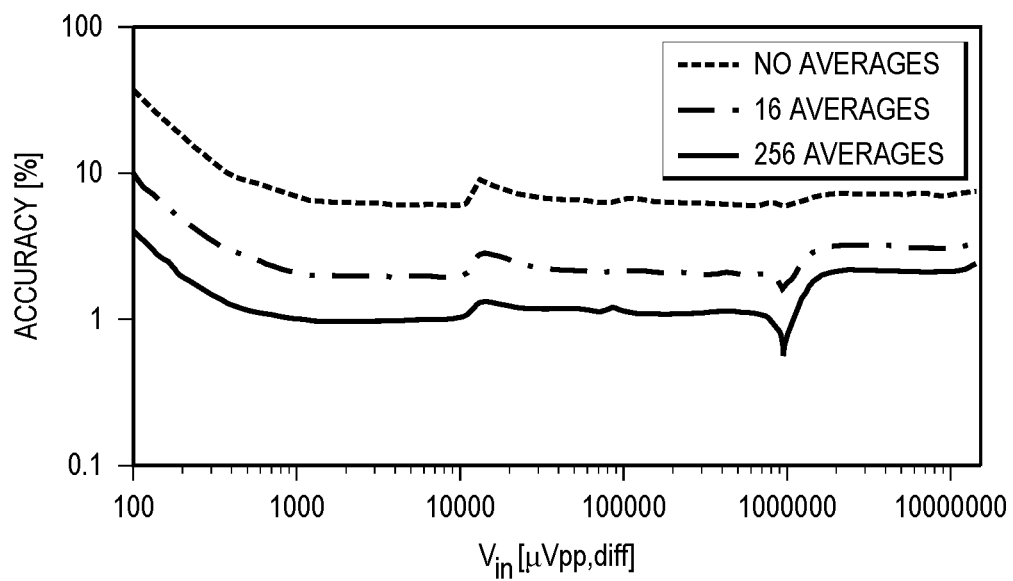

FIGS. 25-26 illustrate measurement accuracy of AGC circuit 100, according to an embodiment. The overall accuracy is calculated by:

$$INL\_static + INL\_statistic + factor_{confidence} \cdot \sigma. \quad [18]$$

With, e.g., $factor_{confidence}$=2 (a typical value for commercial measurement systems) 95% off all measurement results are within boundary as shown in FIG. 25. A typical curve shows for 256 averages accuracy <2 RSSI steps for all ranges and <1 RSSI step for a reduced input range of 200 µVpp<Vin<1 Vpp. With 1 RSSI step being B−1=2.345% accuracy can alternatively be expressed in %, as shown in FIG. 26. Measurement accuracy does not take variation of Vsens due to temperature or voltage supply condition into account, this is discussed somewhere else.

Example Process

Figure 27:
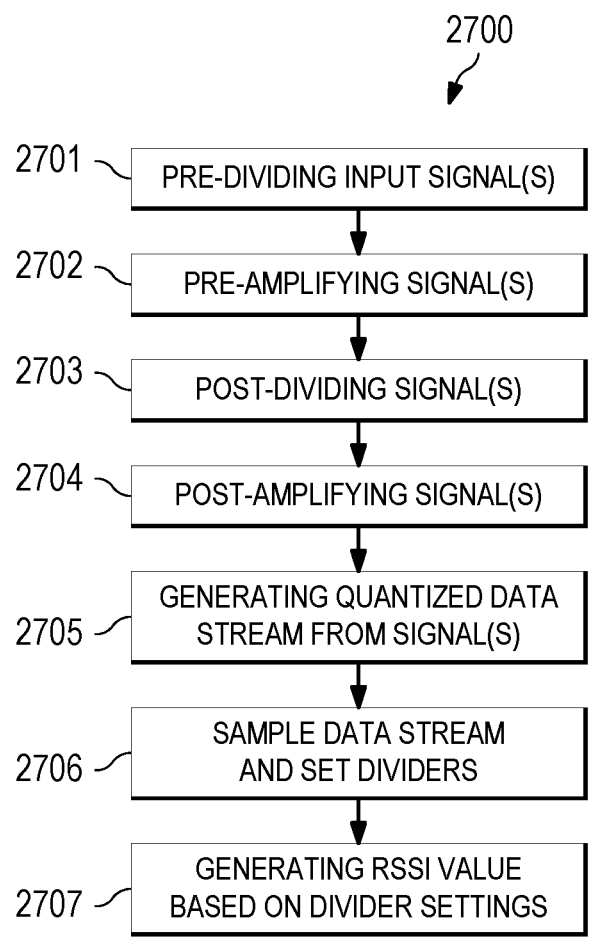
FIG. 27 is a flow diagram of an example process performed by an AGC circuit, according to an embodiment.

FIG. 27 is a flow diagram of an example process 2700 performed by the digital automatic gain control circuit (DAGC) of FIG. 1, according to an embodiment. Process 2700 can be performed by AGC circuit 100. In an embodiment, process 2700 begins by pre-dividing CW input signal(s) (2701), as described in reference to FIG. 2. Process 2700 continues by pre-amplifying the signal(s) (2702), as described in reference to FIG. 3. Process 2700 continues by post-dividing the signal(s) (2703), as described in reference to FIG. 4. Process 2700 continues by post-amplifying the signal(s) (2704), as described in reference to FIG. 5. Process 2700 continues by generating a digital data stream (e.g., quantized data stream) from the signal(s) (2705), as described in reference to FIG. 6. Process 2700 continues by sampling the digital data stream and setting the pre-divider and post-divider based at least on the sampled digital data stream and divider settings (2706). Process 2700 continues by generating RSSI values based on divider setting and pre-divider correction (2707).

While this document contains many specific implementation details, these should not be construed as limitations on the scope of what may be claimed but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

The invention claimed is:

1. A vehicle access system comprising:
   a transducer operable to generate a continuous waveform (CW) voltage signal in response to an electro-magnetic or pure magnetic field;
   an automatic gain control (AGC) circuit coupled to the transducer, the AGC circuit including two or more divider circuits coupled in series that are operable to divide the voltage signal to improve measurement accuracy;
   an analog-to-digital converter (ADC) operable to convert the divided voltage signal into a digital data stream; and
   logic operable to:
      determine at least one setting for at least one of the divider circuits based on the digital data stream; and
      generate a received signal strength value based on the at least one setting.

2. The AGC circuit of claim 1, wherein the digital data stream represents an instantaneous amplitude of the voltage signal at the ADC input during a current period of the voltage signal.

3. The AGC circuit of claim 1, wherein at least one of the divider circuits is configured to have different resolutions.

4. The AGC circuit of claim 1, further comprising:
   an amplifier circuit between at least one of the divider circuits and the ADC input, the amplifier circuit operable to amplify the divided voltage signal.

5. The AGC circuit of claim 1, further comprising:
   a bandpass filter inserted between the transducer and the input of the ADC.

6. The AGC circuit of claim 1, wherein at least one of the divider circuits is operable to bypass the voltage signal based on a strength of the voltage signal and at least one of the divider circuits is operable to bypass the voltage signal based on a strength of the voltage signal.

7. The AGC circuit of claim 1, wherein at least one of the divider circuits is configured as a logarithmic divider.

8. The AGC circuit of claim 1, wherein the ADC is a flash ADC.

9. The AGC circuit of claim 8, wherein the flash ADC is an offset compensated flash ADC.

10. The AGC circuit of claim 1, wherein the logic is further operable to:
    sample the digital data stream over a period of the voltage signal;
    detect a peak value from the sample; and
    determine at least one setting for at least one of the divider circuits based on the detected peak value.

11. The AGC circuit of claim 1, wherein the logic is further operable to:
    sample the digital data stream ninety degrees after a zero crossing of the voltage signal; and
    determine at least one setting for at least one of the divider circuits based on the detected peak value.

12. The AGC circuit of claim 1, wherein at least one of the divider circuits is configured to have input impedance that is substantially constant for all divider circuit settings.

13. The AGC circuit of claim 1, wherein the logic is further configured to send feedback values to at least one of the divider circuits every n period(s) of the voltage signal for use in setting at least one of the divider circuits, where n is a positive integer greater or equal to one.

14. The AGC circuit of claim 13, wherein the feedback values are averaged to reduce an amount of data.

15. The AGC circuit of claim 14, wherein the feedback values are averaged based on at least one of a number of feedback values that occurred during a time period.

16. The AGC circuit of claim 1, wherein the received signal strength values are determined by ADC samples in combination with values of at least one of the divider circuits.

17. The AGC circuit of claim 1, wherein the AGC circuit is further configured to:
    store calibration data for individual attenuations of at least one of the divider circuits to increase an accuracy over a complete range of received signal strength values.

18. The AGC circuit of claim 1, where the logic is further configured to:
    enforce at least one of the dividers to a range setting;
    measure one or more averaged values of at least one of the dividers that result from the voltage signal at the AGC circuit input after the AGC circuit has settled in a first calibration measurement;
    enforce at least one of the dividers to a next range setting and measure one or more averaged values of at least one of the dividers that result from the voltage signal at the AGC circuit input after the AGC circuit has settled and by maintaining an amplitude of the voltage signal at a level related to a preceding measurement for a second calibration measurement;
    store a difference of the values derived from the first and second calibration measurements as a calibration value;
    repeat the calibration measurement and store steps for other ranges; and
    calculate each received signal strength value from a current measured value and from a summation of stored calibration values of ranges which are less than or equal to a current range setting.

19. The AGC circuit of claim 1, wherein the divider circuits are part of a chain of circuits that are coupled in series and include a pre-divider circuit, followed by pre-amplifier circuit, followed by a post-divider circuit.

20. The AGC circuit of claim 19, wherein the divider circuits are part of a chain of circuits that are coupled in series and include a pre-divider circuit, followed by pre-amplifier circuit, followed by a post-divider circuit, followed by a post-amplifier circuit.

* * * * *

UNITED STATES PATENT AND TRADEMARK OFFICE
CERTIFICATE OF CORRECTION

| | | |
|---|---|---|
| PATENT NO. | : 10,158,336 B2 | Page 1 of 1 |
| APPLICATION NO. | : 15/627214 | |
| DATED | : December 18, 2018 | |
| INVENTOR(S) | : Werner Blatz et al. | |

It is certified that error appears in the above-identified patent and that said Letters Patent is hereby corrected as shown below:

In the Specification

Column 4, Line 29; replace:
"put voltage ($V_{post\_out\_p}$), where the post-divider ratio"
With:
-- put voltage ($V_{post\_div\_out\_p}$), where the post-divider ratio --

Signed and Sealed this
Fourth Day of February, 2020

Andrei Iancu
*Director of the United States Patent and Trademark Office*